United States Patent
Katz et al.

(10) Patent No.: US 10,566,501 B2
(45) Date of Patent: Feb. 18, 2020

(54) METHOD FOR PRODUCING AN OPTOELECTRONIC SEMICONDUCTOR DEVICE AND OPTOELECTRONIC SEMICONDUCTOR DEVICE

(71) Applicant: OSRAM Opto Semiconductors GmbH, Regensburg (DE)

(72) Inventors: Simeon Katz, Regensburg (DE); Kai Gehrke, Oldenburg (DE); Massimo Drago, Riedenburg (DE); Joachim Hertkorn, Wörth an der Donau (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/737,724

(22) PCT Filed: Jun. 16, 2016

(86) PCT No.: PCT/EP2016/063891
§ 371 (c)(1),
(2) Date: Dec. 18, 2017

(87) PCT Pub. No.: WO2016/202924
PCT Pub. Date: Dec. 22, 2016

(65) Prior Publication Data
US 2018/0190874 A1 Jul. 5, 2018

(30) Foreign Application Priority Data

Jun. 18, 2015 (DE) .................. 10 2015 109 786

(51) Int. Cl.
| | |
|---|---|
| H01L 33/00 | (2010.01) |
| H01L 33/42 | (2010.01) |
| H01L 33/12 | (2010.01) |
| H01L 31/0224 | (2006.01) |
| H01L 31/0304 | (2006.01) |
| H01L 33/32 | (2010.01) |

(52) U.S. Cl.
CPC ...... *H01L 33/42* (2013.01); *H01L 31/022475* (2013.01); *H01L 31/03044* (2013.01);
(Continued)

(58) Field of Classification Search
CPC ..... H01L 33/00; H01L 33/0075; H01L 33/32; H01L 33/42; H01L 33/12; H01L 31/00;
(Continued)

(56) References Cited

U.S. PATENT DOCUMENTS

| | | | |
|---|---|---|---|
| 6,821,655 B1 | 11/2004 | Ohta et al. | |
| 7,989,828 B2 | 8/2011 | Song | |

(Continued)

FOREIGN PATENT DOCUMENTS

| | | |
|---|---|---|
| EP | 2264793 A2 | 12/2010 |
| JP | H11284227 A | 10/1999 |

(Continued)

*Primary Examiner* — Chuong A Luu
(74) *Attorney, Agent, or Firm* — Slater Matsil, LLP

(57) ABSTRACT

A method for producing an optoelectronic semiconductor device and an optoelectronic semiconductor device are disclosed. In an embodiment the method includes providing a semiconductor layer sequence including a light-emitting and/or light-absorbing active zone and a top face downstream of the active zone in a stack direction extending perpendicular to a main plane of extension of the semiconductor layer sequence, applying a layer stack onto the top face, wherein the layer stack includes an oxide layer containing indium, and an intermediate face downstream of the top face in the stack direction and applying a contact layer onto the intermediate face, wherein the contact layer includes indium tin oxide, and wherein the layer stack is, within the bounds of manufacturing tolerances, free of tin.

19 Claims, 4 Drawing Sheets

(52) U.S. Cl.
CPC .......... *H01L 33/0075* (2013.01); *H01L 33/12* (2013.01); *H01L 33/32* (2013.01); *H01L 2933/0016* (2013.01)

(58) Field of Classification Search
CPC ............. H01L 31/0224; H01L 31/0304; H01L 31/022475; H01L 2933/0016
USPC .............................................. 257/99; 438/22
See application file for complete search history.

(56) References Cited

U.S. PATENT DOCUMENTS

| | | |
|---|---|---|
| 8,202,751 B2 | 6/2012 | Seong et al. |
| 2010/0052009 A1* | 3/2010 | Shim ........................ H01L 33/14 257/103 |
| 2010/0200881 A1 | 8/2010 | Masaki |
| 2011/0284893 A1 | 11/2011 | Hoeppel et al. |
| 2012/0199861 A1 | 8/2012 | Tsuji |
| 2013/0037796 A1* | 2/2013 | Wu ........................ H01L 33/02 257/43 |
| 2014/0124817 A1 | 5/2014 | Kraus |

FOREIGN PATENT DOCUMENTS

| | | |
|---|---|---|
| JP | 2001089846 A | 4/2001 |
| JP | 2007053383 A | 3/2007 |
| JP | 2008506272 A | 2/2008 |
| JP | 2009054889 A | 3/2009 |
| JP | 2013115341 A | 6/2013 |

\* cited by examiner

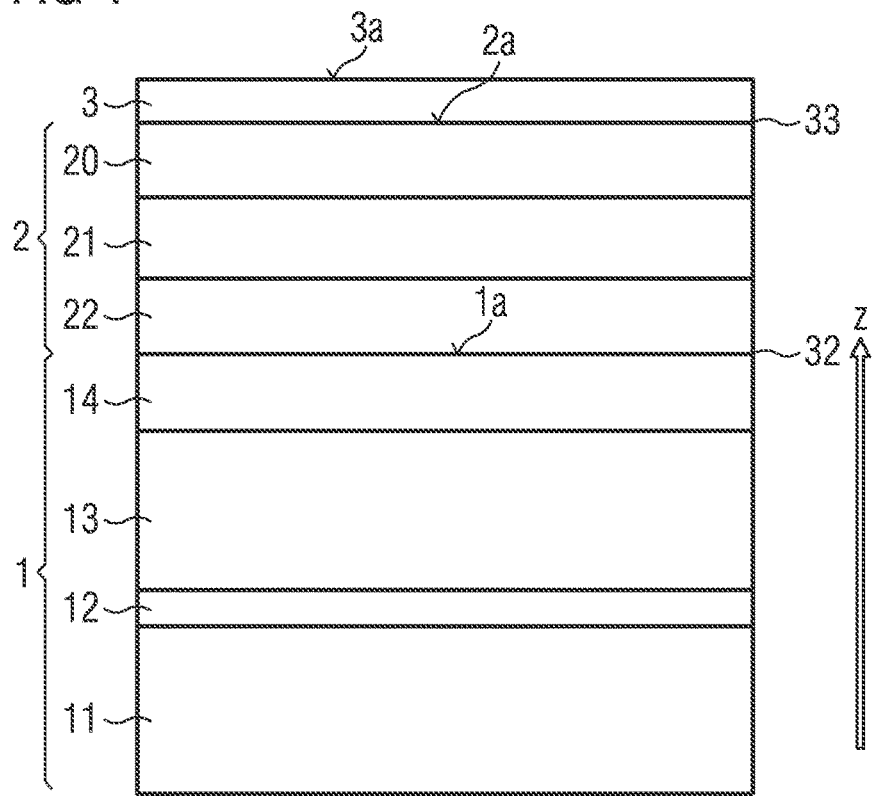
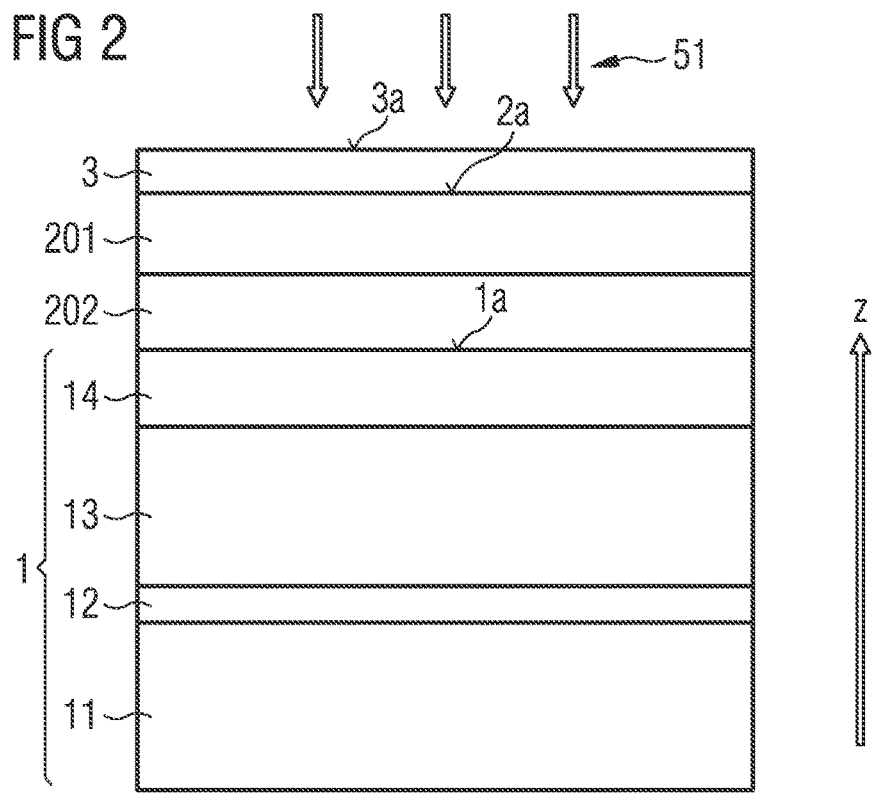

METHOD FOR PRODUCING AN OPTOELECTRONIC SEMICONDUCTOR DEVICE AND OPTOELECTRONIC SEMICONDUCTOR DEVICE

This patent application is a national phase filing under section 371 of PCT/EP2016/063891, filed Jun. 16, 2016, which claims the priority of German patent application 10 2015 109 786.9, filed Jun. 18, 2015, each of which is incorporated herein by reference in its entirety.

TECHNICAL FIELD

U.S. Patent Application Publication No. 2011/0284893 A1 describes a method for producing an optoelectronic semiconductor device and an optoelectronic semiconductor device.

SUMMARY OF THE INVENTION

Embodiments of the invention provide a method for producing an optoelectronic semiconductor device with improved electrical contacting. Further embodiments provide an optoelectronic semiconductor device with improved electrical contacting.

The optoelectronic semiconductor device may be designed to emit and/or absorb light during operation. The optoelectronic semiconductor device is, for example, a light-emitting diode, a photodiode and/or a semiconductor laser diode.

According to at least one embodiment of the method, a semiconductor layer sequence is provided. The semiconductor layer sequence has a main plane of extension in which it extends in lateral directions. A stack direction of the semiconductor layer sequence extends perpendicular to the main plane of extension. Along the stack direction, the semiconductor layer sequence has a thickness which is small in comparison with the maximum extent of the semiconductor layer sequence in the lateral directions. A main plane of the semiconductor layer sequence forms a top face of the semiconductor layer sequence.

The semiconductor layer sequence may be grown epitaxially, in particular by means of metal-organic vapor phase epitaxy (MOVPE), on a growth carrier. It is here possible for the growth carrier to be removed again from the semiconductor layer sequence in a method step subsequent to growth. The semiconductor layer sequence may contain a multiplicity of semiconductor layers which are arranged one above the other in the stack direction. Each of the semiconductor layers may extend along the main plane of extension. The semiconductor layers may be formed with a semiconductor material. In particular, the semiconductor layer sequence may be based on a nitride compound semiconductor material.

"Based on nitride compound semiconductors" may here and hereinafter mean that the semiconductor layer sequences or at least one semiconductor layer thereof, preferably each semiconductor layer of the semiconductor layer sequence, comprises a nitride-III/V compound semiconductor material, preferably $Al_yIn_xGa_{1-x-y}N$, wherein $0 \leq x \leq 1$, $0 \leq y \leq 1$ and $x+y \leq 1$. Here, this material does not necessarily have a mathematically exact composition according to the above formula. Instead, it may include one or more dopants and additional constituents which do not substantially modify the characteristic physical properties of the $Al_yIn_xGa_{1-x-y}N$ material. For simplicity's sake, however, the above formula includes only the fundamental constituents of the crystal lattice (Al, Ga, In, N), even if these may in part be replaced by small quantities of further substances.

According to at least one embodiment of the method, the semiconductor layer sequence comprises a light-emitting and/or light-absorbing active zone. The top face of the semiconductor layer sequence is downstream of the active zone in the stack direction. In particular, the active zone emits or absorbs light in the visible and/or ultraviolet region of the electromagnetic spectrum. The emitted light may have a wavelength, in particular a peak wavelength, of at least 200 nm and at most 540 nm, preferably at least 400 nm and at most 500 nm and particularly preferably at least 430 nm and at most 470 nm.

The semiconductor layer sequence, for example, comprises a first semiconductor layer, the active zone, a second semiconductor layer and a highly doped semiconductor layer. The highly doped semiconductor layer may, for example, be p-doped. The active zone may be arranged between the first and second semiconductor layers. The active zone may here, for example, take the form of a layer or layer sequence and be formed with a semiconductor material. The highly doped semiconductor layer may be arranged on the second semiconductor layer in the stack direction. It is in particular possible for the second semiconductor layer and the highly doped semiconductor layer to be in direct contact with one another and in particular to be electrically conductively connected to one another. An outer face of the highly doped semiconductor layer may form the top face.

The highly doped semiconductor layer may in particular be doped with magnesium. The magnesium dopant concentration in the highly doped semiconductor layer may amount to at least $5*10^{19}/cm^3$, preferably at least $1.0*10^{20}/cm^3$ and particularly preferably at least $1.2*10^{20}/cm^3$, and at most $9*10^{20}/cm^3$, preferably at most $5*10^{20}/cm^3$ and particularly preferably at most $2*10^{20}/cm^3$. The highly doped semiconductor layer may, for example, be activated with an oxygen-containing gas.

According to at least one embodiment of the method, a layer stack is applied to the top face. The layer stack may, for example, be applied onto the top face by means of epitaxial deposition and/or sputtering. The layer stack may have a plurality of layers which are arranged one above the other in the stack direction and may in each case extend along the main plane of extension.

The layer stack has an oxide layer which contains indium. In particular, the oxide layer may contain indium oxide, preferably $In_2O_3$, or, within the bounds of manufacturing tolerances, consist thereof. A layer consisting of a material "within the bounds of manufacturing tolerances" here and hereinafter means that production-related impurities of a further material may be present in said layer.

The layer stack furthermore comprises an intermediate face which is downstream of the top face in the stack direction. The intermediate face may be an outer face of the layer stack remote from the semiconductor layer sequence. In particular, the intermediate face may be formed by an outer face of the oxide layer.

The layer stack and in particular the oxide layer may be light-transmitting. A layer or layer stack is here and hereinafter "light-transmitting" if said layer or layer stack has a transmission coefficient for the light emitted or absorbed by the active zone during operation of the optoelectronic semiconductor device of at least 80%, preferably at least 90% and particularly preferably at least 95%.

It is furthermore possible for the layer stack to be electrically conductive. In particular, the layer stack may be electrically conductively connected to the semiconductor layer sequence. For example, the layer stack is in direct electrical contact with the highly doped semiconductor layer.

According to at least one embodiment of the method, a contact layer is applied onto the intermediate face. The contact layer is formed with indium tin oxide (ITO). In particular, the contact layer may, within the bounds of manufacturing tolerances, consist of indium tin oxide. For example, the contact layer is formed with $In_aSn_{1-a}O$, with $0.75 \leq a \leq 0.99$, preferably $a \leq 0.98$.

The contact layer may in particular be applied using a plasma-free deposition method, such as, for example, MOVPE. As a result, a monocrystalline contact layer may be obtained which may be free of grain boundaries. In contrast, it is possible for a contact layer, applied, for example, by means of sputtering, still to have grain boundaries.

The contact layer may be light-transmitting. For example, an outer face of the contact layer remote from the layer stack may form a light passage face of the optoelectronic semiconductor device. Light may be coupled out from or injected into the optoelectronic semiconductor device through the light passage face.

In particular, the contact layer is electrically conductive. The contact layer may serve for electrically contacting the semiconductor layer sequence. In particular, the contact layer may be electrically conductively connected to the semiconductor layer sequence by means of the layer stack.

According to at least one embodiment of the method, the layer stack is, within the bounds of manufacturing tolerances, free of tin. A layer or layer stack being, within the bounds of manufacturing tolerances, free of an element and/or a material may here and hereinafter mean that merely traces of said element and/or material are present in the layer or layer stack as a result of production-related contaminants. Diffusion of the element and/or material from adjacent layers into the layer or the layer stack should here likewise be considered to be production-related contamination. The layer stack thus contains, within the bounds of manufacturing tolerances, no tin, in particular no indium tin oxide. In particular, the number of tin atoms in the layer stack may amount to at most 1%, preferably at most 0.5% and particularly preferably at most 0.1%, of the number of indium atoms in the layer stack or tin is not detectable in the layer stack.

According to at least one embodiment of the method for producing an optoelectronic semiconductor device, the method comprises the following steps: providing a semiconductor layer sequence, including a light-emitting and/or light-absorbing active zone and a top face downstream of the active zone in a stack direction extending perpendicular to a main plane of extension of the semiconductor layer sequence, applying a layer stack onto the top face, wherein the layer stack comprises an oxide layer, which contains indium, and an intermediate face downstream of the top face in the stack direction, applying a contact layer, which is formed with indium tin oxide, onto the intermediate face, wherein the layer stack is, within the bounds of manufacturing tolerances, free of tin.

The method steps may be performed in the stated sequence.

In the method described here for producing an optoelectronic semiconductor device, the intention is to avoid direct application of the contact layer onto the semiconductor layer sequence in order to improve electrical contacting of the semiconductor layer sequence. To this end, the layer stack is arranged between the semiconductor layer sequence and the contact layer. By means of the layer stack, the contact layer can be prevented from directly adjoining the semiconductor layer sequence and in particular the top face of the semiconductor layer sequence may already be protected prior to deposition of the contact layer.

In an alternative semiconductor device, in which the contact layer is applied directly onto the top face of the semiconductor layer sequence, for example, by means of sputtering, and no layer stack is thus present, cracks, contaminants and/or defects may occur in the semiconductor layer sequence and/or contact layer in an alternative boundary region between the contact layer and the semiconductor layer sequence. As a result, electrical contact between the contact layer and the semiconductor layer sequence may be impaired in the alternative semiconductor device and consequently in particular the voltage drop at the alternative boundary region may be increased.

Introducing the layer stack may reduce the voltage drop at the semiconductor device by up to 100 mV in comparison with the alternative semiconductor device. It has here surprisingly been found that, due to the layer stack, it is possible to improve material quality, for example, the quality of the crystal structure and/or intactness, in a first boundary region between the semiconductor layer sequence and the layer stack and/or in a second boundary region between the layer stack and the contact layer. In particular the oxide layer which contains indium may here contribute to improving crystal quality and/or to protecting the crystal structure of the top face of the semiconductor layer sequence.

According to at least one embodiment of the method, a nitride layer which contains indium is firstly provided for application of the oxide layer. The nitride layer may be provided by a growth method, such as, for example, MOVPE, molecular beam epitaxy (MBE) or sputtering.

The nitride layer may in particular be formed with or consist of indium nitride, preferably InN. The nitride layer may be opaque. A layer is here and hereinafter "opaque" if the layer has a transmission coefficient for the light emitted or absorbed by the active zone during operation of the optoelectronic semiconductor device of at most 60%, preferably at most 50% and particularly preferably at most 40%. In particular, an opaque layer may an energy band gap which is smaller in magnitude than the energy of a photon of the light emitted and/or absorbed by the active zone.

According to at least one embodiment of the method, the nitride layer is at least partially oxidized in an oxidation step to yield the oxide layer. The oxidation step may take place in a method step subsequent to deposition of the nitride layer. The oxidation step may, for example, be carried out directly after deposition. It is alternatively or additionally possible for the oxidation step to be carried out as early as during deposition.

For oxidation, an oxygen-containing gas may be admitted into a reaction chamber, in which at least the oxidation step is carried out. During oxidation of the nitride layer, the nitrogen present in the nitride layer is replaced by oxygen. After the oxidation step, the layer stack may contain nitrogen merely in places. Alternatively or additionally, the layer stack may be light-transmitting after oxidation. It is furthermore possible for the nitride layer to be completely oxidized in the oxidation step to yield the oxide layer. In particular, after the oxidation step, the oxide layer may, within the bounds of manufacturing tolerances, be free of nitrogen.

According to at least one embodiment of the method, application of the oxide layer comprises the following steps:

providing a nitride layer which contains indium and at least partially oxidizing the nitride layer in an oxidation step to yield the oxide layer.

According to at least one embodiment of the method, the nitride layer is provided by means of epitaxial deposition. In particular, the nitride layer may be grown epitaxially on layers of the semiconductor device to be produced which have been provided in preceding method steps.

In contrast with direct deposition of the oxide layer, it is not necessary to provide oxygen for deposition of the nitride layer. The oxygen required for oxidation may be provided solely in the oxidation step. This may also proceed outside a chamber for epitaxial growth. The oxidation step may in particular be necessary due to possible opacity of the nitride layer.

According to at least one embodiment of the method, the oxidation step is carried out after application of the contact layer. The contact layer is thus firstly deposited onto the intermediate face of the layer stack and then the oxidation step is carried out. The nitride layer is then oxidized through the contact layer. It is here possible for the contact layer likewise to be partially oxidized.

According to at least one embodiment of the method, at least the oxidation step is carried out in a reaction chamber. It is possible for further method steps to be carried out in the reaction chamber. The reaction chamber may in particular be the chamber used for epitaxial deposition by means of MOVPE.

During the oxidation step, a reaction temperature in the reaction chamber amounts to at least 460° C., preferably at least 480° C. and particularly preferably at least 500° C. The reaction temperature furthermore amounts to at most 720° C., preferably at most 700° C. and particularly preferably at most 650° C. The nitride layer is thus heat-treated. It is furthermore possible for oxygen-containing gas, in particular oxygen-containing gas, to be introduced into the reaction chamber during the oxidation step. Oxidation of the nitride layer is enabled by providing oxygen and simultaneously establishing the reaction temperature.

According to at least one embodiment of the method, the oxide layer is applied by means of epitaxial deposition of indium oxide. In particular, the oxide layer is grown epitaxially, for example, by means of MOVPE, on layers of the semiconductor device to be produced which have been provided in preceding method steps. It is here in particular possible for the method not to comprise a separate oxidation step for oxidizing a nitride layer For example, the semiconductor layer sequence may firstly be grown epitaxially on the growth carrier. The semiconductor layer sequence is, for example, formed with $In_nGa_{1-n}N$. By gradually reducing gallium and/or nitrogen and increasing the oxygen content in the reaction chamber, it is possible to change over to epitaxially growing indium oxide or optionally indium nitride.

According to at least one embodiment of the method, the nitride layer is deposited epitaxially under three-dimensional growth conditions. The oxide layer may furthermore be deposited under three-dimensional growth conditions. It is also possible for the entire layer stack to be deposited epitaxially under three-dimensional growth conditions.

Three-dimensional growth may be described by the Volmer-Weber growth model or by the Stranski-Krastanov growth model. Specific growth conditions, such as, for example, a reduction in reactor temperature, an increase in reactor pressure and/or a reduction in the V/III ratio, are in particular necessary for three-dimensional growth. In the case of three-dimensional growth, the growth rate along the stack direction may be increased in comparison with the growth rate along at least one of the lateral directions.

According to at least one embodiment of the method, the nitride layer has a multiplicity of multilayer islands which are not joined together. It is alternatively possible for the oxide layer to be deposited epitaxially under three-dimensional growth conditions in such a manner that the oxide layer has multilayer islands which are not joined together. In particular, the islands are not joined together in lateral directions. In other words, the nitride layer and/or the oxide layer is/are not contiguous. In particular, the intermediate face may be non-contiguous. For example, the islands have a trapezoidal and/or triangular cross-section along the stack direction. The islands may be pyramidal and/or truncated pyramidal. "Multilayer" means here and hereinafter that the islands contain a plurality of monolayers grown on one another. A "monolayer" should here and hereinafter be taken to mean a continuous layer of atoms or molecules, wherein the layer height amounts to just one atom or molecule. In particular, no identical atoms or molecules are located on top of one another in a monolayer.

Epitaxial deposition under three-dimensional growth conditions may in particular result in incomplete coverage of the top face by the nitride layer and thus by the oxide layer. In other words, in the regions between the islands of the oxide layer, the top face is free of the nitride layer. The oxide layer or optionally the nitride layer may, for example, be grown directly on the top face. In this case, in the regions between the islands of the oxide layer or the nitride layer, the top face may be freely accessible directly after growth of the oxide layer or nitride layer.

According to at least one embodiment of the method, the nitride layer is deposited epitaxially under three-dimensional growth conditions in such a manner that the nitride layer has a multiplicity of multilayer islands which are not joined together.

It is furthermore possible for the oxide layer to be deposited epitaxially under three-dimensional growth conditions in such a manner that the oxide layer has a multiplicity of multilayer islands which are not joined together.

According to at least one embodiment of the method, epitaxial deposition proceeds under two-dimensional growth conditions. In particular, the oxide layer or the nitride layer is epitaxially deposited under two-dimensional growth conditions. It is also possible for the entire layer stack to be deposited epitaxially under two-dimensional growth conditions.

In two-dimensional growth, the atomic layers of the oxide layer are grown monolayer by monolayer. For example, the two-dimensionally grown oxide layer and/or nitride layer comprises in the stack direction at least one and at most three, preferably at most two, monolayers. Two-dimensional growth may, for example, be described by a Frank-van-der-Merve growth model or by the Stranski-Krastanov growth model. In two-dimensional growth, the growth rate along at least one of the lateral directions may be higher than or equally high as the growth rate along the stack direction.

According to at least one embodiment of the method, the oxide layer is contiguous. In other words, the oxide layer is of one-piece construction. In particular, the intermediate face may be simply connected. In particular, the oxide layer may completely cover the top face. In other words, the top face is no longer freely accessible once the nitride layer or oxide layer has been deposited. It is furthermore possible for the entire layer stack to be contiguous.

According to at least one embodiment of the method, epitaxial deposition proceeds under two-dimensional growth conditions in such a manner that the oxide layer is contiguous.

According to at least one embodiment of the method, the layer stack comprises a first interlayer. The first interlayer is formed with indium gallium oxide, preferably $InGaO_3$. The first interlayer may, within the bounds of manufacturing tolerances, consist of indium gallium oxide.

According to at least one embodiment of the method, a nitride interlayer which is formed with indium gallium nitride is initially epitaxially deposited for application of the first interlayer. The nitride interlayer may, for example, be directly epitaxially deposited onto the top face. In particular, the nitride interlayer is deposited before the nitride layer is deposited. The nitride interlayer may thus be arranged upstream from the nitride layer in the stack direction. The nitride interlayer layer is then at least partially oxidized in the oxidation step to yield the first interlayer. In particular, the nitride interlayer is oxidized to yield the first interlayer in the same method step as the nitride layer is oxidized to yield the oxide layer. After the oxidation step, the first interlayer is arranged between the semiconductor layer sequence and the oxide layer. In particular, the first interlayer may directly adjoin the oxide layer.

Alternatively, the first interlayer may be provided by means of epitaxial deposition of indium gallium oxide, in particular onto the top face.

According to at least one embodiment of the method, the contact layer is applied onto the intermediate face under growth conditions in which, in the event of direct application onto the top face, a (100) orientation of the crystal structure of the contact layer would be obtained and wherein the crystal structure of the contact layer has a (111) crystal orientation. The numbers between brackets here indicate the Miller indices of the lattice plane closest to the top face. In a (100) crystal orientation, the outer faces of the crystal are parallel to one of the cube faces of the structure cell. In a (111) crystal orientation, the outer faces of the crystal are located diagonally to the structure cells thereof. It has here surprisingly been found that, despite selecting for growth conditions for a (100) crystal orientation, a (111) crystal orientation of the crystal structure of the contact layer is formed. Such a (111) crystal orientation is, for example, distinguished by particularly good electrical contact to the underlying layers.

In an alternative semiconductor device, in which the contact layer is applied directly onto the top face, growth conditions for (100) crystal orientation of the contact layer are selected, since here a better connection and/or a better crystal quality of the boundary region between the contact layer and the top face are obtained.

An optoelectronic semiconductor device is furthermore provided. The optoelectronic semiconductor device can preferably be produced by means of one of the methods described here. That is to say, all the features disclosed for the method are also disclosed for the semiconductor device and vice versa.

According to at least one embodiment of the optoelectronic semiconductor device, the latter comprises a semiconductor layer sequence with a light-emitting and/or light-absorbing active zone and with a top face which is downstream of the active zone in a stack direction extending perpendicular to a main plane of extension of the semiconductor layer sequence. The optoelectronic semiconductor device furthermore comprises a layer stack applied to the top face with an oxide layer, which contains indium, and an intermediate face downstream of the top face in the stack direction. The optoelectronic semiconductor device also comprises a contact layer, which is formed with indium tin oxide, applied to the intermediate face. The layer stack is, within the bounds of manufacturing tolerances, free of tin.

Verification that the layer stack is, within the bounds of manufacturing tolerances, free of tin can be obtained, for example, by means of EDX analysis (EDX=energy-dispersive X-ray spectroscopy) on the completed semiconductor device. Using EDX analysis, it is in particular possible to investigate the elemental composition of the individual layers of the optoelectronic semiconductor device. In particular, EDX analysis can provide an EDX spectrum of the chemical elements in the semiconductor device as a function of the position of the investigated layer along the stack direction. For example, starting from the top face of the semiconductor layer sequence, the oxygen content in the EDX spectrum initially increases in the stack direction. From the intermediate face, the tin content in the EDX spectrum may, for example, increase.

For example, the oxide layer may have been produced by at least partial oxidation of a nitride layer. Such oxidation is, for example, detectable by the presence of nitrogen in the oxide layer. It is alternatively possible for the oxide layer to have been produced by epitaxial deposition of indium oxide. In the case of epitaxial deposition of the oxide layer, a continuous change in the crystal structure and/or chemical composition of the individual layers, in particular over a plurality of monolayers, is obtained in the stack direction. A transitional zone in which the composition of the crystal changes is formed between the successively grown individual layers, in particular between the optionally present first interlayer and the oxide layer. The transitional zone may have a thickness of one to two monolayers in the stack direction. Use of an epitaxial deposition method can be detected on the completed semiconductor device on the basis of the presence of such a transitional zone.

According to at least one embodiment of the optoelectronic semiconductor device, the oxide layer is, within the bounds of manufacturing tolerances, free of gallium. In other words, the oxide layer does not consist of indium gallium oxide. Production-related gallium impurities may here be present in the oxide layer. For example, the number of gallium atoms in the oxide layer amounts to at most 1%, preferably at most 0.5% and particularly preferably at most 0.1%, of the number of indium atoms in the oxide layer. EDX analysis is likewise capable of detecting that the oxide layer is, within the bounds of manufacturing tolerances, free of gallium.

According to at least one embodiment of the optoelectronic semiconductor device, the layer stack has a first interlayer which is formed with indium gallium oxide. The first interlayer is arranged between the semiconductor layer sequence and the oxide layer. The first interlayer directly adjoins the oxide layer. The first interlayer may furthermore directly adjoin the top face of the semiconductor layer sequence. Alternatively, a second interlayer may be arranged between the first interlayer and the semiconductor layer sequence.

For example, the first interlayer may have been produced by at least partial oxidation of a nitride interlayer. Such oxidation is, for example, detectable by the presence of nitrogen in the first interlayer. It is alternatively possible for the first interlayer to have been produced by epitaxial deposition of indium gallium oxide, for example, onto the top face. In particular, the epitaxial growth of the semiconductor layers of the semiconductor layer sequence may continuously transition into the epitaxial growth of the first interlayer by the nitrogen used in growing the semiconductor layer sequence being continuously replaced by oxygen.

According to at least one embodiment of the optoelectronic semiconductor device, the layer stack comprises a second interlayer. The second interlayer is formed with indium gallium nitride. The second interlayer may, within the bounds of manufacturing tolerances, consist of indium gallium nitride. The second interlayer is arranged between the semiconductor layer sequence and the first interlayer. The second interlayer furthermore directly adjoins the top face. The second interlayer is, within the bounds of manufacturing tolerances, free of oxygen.

It is in particular possible for the layer stack exclusively to consist of the first interlayer, the second interlayer and the oxide layer. In particular, the layer stack may comprise, in the stack direction, firstly the second interlayer, then the first interlayer and subsequently the oxide layer.

According to at least one embodiment of the optoelectronic semiconductor device, the layer stack includes indium nitride. A production method for the oxide layer can be detected on the completed semiconductor device on the basis of such presence of indium nitride. It is accordingly in particular possible for the oxide layer to have been produced by deposition of a nitride layer and subsequent oxidation of the nitride layer in the oxidation step. In the event of incomplete oxidation of the nitride layer, residues of indium nitride remain present in the layer stack. These residues may be detected, for example, using EDX analysis, by means of X-ray diffraction (XRD) and/or by means of spectroscopy.

According to at least one embodiment of the optoelectronic semiconductor device, the crystal structure of the contact layer has a (iii) crystal orientation. The crystal structure of the contact layer may, for example, be determined using X-ray methods and/or electron microscopy diffraction methods.

According to at least one embodiment of the optoelectronic semiconductor device, the oxide layer has a multiplicity of multilayer islands which are not joined together. In other words, the oxide layer has been grown by means of three-dimensional growth. The extent of the islands in lateral directions may in particular amount to at most the wavelength of the light emitted and/or absorbed by the active zone. The islands, for example, serve as outcoupling structures for the light emitted in the direction of the oxide layer by the active zone. Alternatively or additionally, the islands may serve as injection structures for the light incident from the direction of the oxide layer and absorbed by the active zone. Outcoupling or injection structures may here and hereinafter be structures which improve the transmission of the emitted and/or absorbed light at the interface between the islands and the layers directly adjoining the islands in the stack direction. In particular, the islands may to this end have an average extent in the lateral directions which at most corresponds to the wavelength of the light. In other words, reflection of the light impinging on said interface is reduced.

According to at least one embodiment of the optoelectronic semiconductor device, the oxide layer is contiguous. In other words, the oxide layer has no holes and/or recesses. In particular, the oxide layer is of one-piece construction. A contiguous oxide layer may have been grown under two-dimensional growth conditions.

According to at least one embodiment of the optoelectronic semiconductor device, the average thickness of the oxide layer along the stack direction amounts to at least 0.5 and at most three monolayers. The average thickness of the oxide layer is here the mathematically averaged thickness. It is accordingly in particular possible for the oxide layer to have regions in which the oxide layer locally has a thickness which amounts to more than three monolayers or less than 0.5 monolayers.

According to at least one embodiment of the optoelectronic semiconductor device, the average height of the islands along the stack direction amounts to at least 50, preferably at least 100, and at most 200, preferably at most 160, monolayers. In particular, the average height of the islands may amount to at least 25 nm, preferably at least 50 nm, and at most 100 nm, preferably at most 80 nm. The height of the islands is here defined by the number of monolayers in an island. The average height of the islands is the number of monolayers of all the islands averaged over the number of islands. It is accordingly in particular possible for at least one of the islands to have a number of less than 50, preferably less than 100, or more than 200, preferably more than 160, monolayers.

According to at least one embodiment of the optoelectronic semiconductor device, a first boundary region between the semiconductor layer sequence and the layer stack and/or a second boundary region between the layer stack and the contact layer have a lower density of defects than an alternative boundary region between a semiconductor layer sequence and a contact layer of an alternative semiconductor device, in which the contact layer is applied directly onto the semiconductor layer. In particular, the alternative boundary region may have a higher number of contaminants, defects and/or instances of damage than the first and/or second boundary region.

In the alternative boundary region, deposition of the contact layer onto the semiconductor layer sequence results in damage to the top face of the semiconductor layer sequence. In particular, the contact layer and the semiconductor layer sequence are formed with extremely different materials, whereby production-related contaminants and/or defects are formed. Introducing the layer stack between the semiconductor layer sequence and the contact layer permits gradual adaptation of the crystal structure and/or materials.

BRIEF DESCRIPTION OF THE DRAWINGS

The method described here and the optoelectronic semiconductor device described here are explained in greater detail below with reference to exemplary embodiments and the associated figures.

FIG. 1 shows an exemplary embodiment of a semiconductor device described here.

FIG. 2 shows a method step of an exemplary embodiment of a method described here.

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 3:
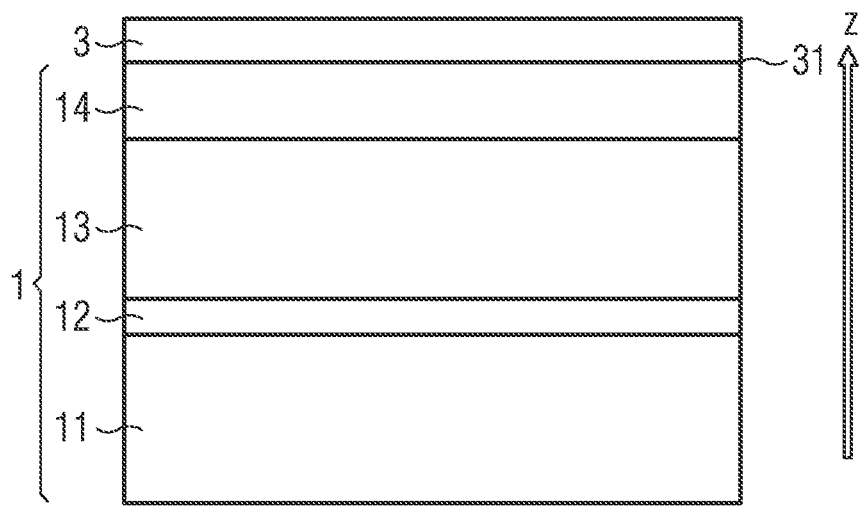
FIG. 3 shows an alternative optoelectronic semiconductor device.

An exemplary embodiment of an optoelectronic semiconductor device described here is explained in greater detail with reference to the schematic sectional representation of FIG. 1. The semiconductor device comprises a semiconductor layer sequence 1, a layer stack 2 and a contact layer 3.

The semiconductor layer sequence 1 extends along a main plane of extension. The stack direction z extends perpendicular to the main plane of extension.

The semiconductor layer sequence 1 successively comprises in the stack direction a first semiconductor layer 11, an active zone 12, a second semiconductor layer 13 and a highly doped semiconductor layer 14. The first semiconductor layer 11 may, for example, be an n-conductive semiconductor layer. The second semiconductor layer 13 may be p-conductive. The active zone 12 is provided for emitting and/or detecting light. An outer face of the highly doped semiconductor layer 14 forms the top face 1a of the semiconductor layer sequence 1. The top face 1a succeeds the active zone 12 of the semiconductor layer sequence 1 in the stack direction z.

The highly doped semiconductor layer 14 may be p-conductive and be doped with magnesium. The highly doped semiconductor layer 14 may, for example, have been activated in a method step with oxygen, in particular using an oxygen-containing gas. To this end, subsequent to epitaxial deposition of the highly doped semiconductor layer 14 in the reaction chamber, the temperature in the reaction chamber may be reduced to approx. 615° C. With addition of an oxygen-containing gas, the p-conductive material of the highly doped semiconductor layer may be activated in a further process step.

The layer stack 2 is applied onto the top face 1a. Layer stack 2 comprises a second interlayer 22, a first interlayer 21 and an oxide layer 20. The second interlayer 22 is applied to the top face 1a of the semiconductor layer sequence 1. The second interlayer 22 may, for example, be formed with indium gallium nitride. The first interlayer 21 may, for example, be formed with indium gallium oxide. The oxide layer 20 may furthermore be formed with or consist of indium oxide. An outer face of the oxide layer 20 remote from the semiconductor layer sequence 1 forms an intermediate face 2a of the layer stack 2.

Unlike the representation in FIG. 1, it is possible for no second interlayer 22 to be present and for the first interlayer 21 to be applied directly onto the top face 1a. It is also possible for the layer stack 2 exclusively to comprise the oxide layer 20.

The contact layer 3 is applied to the intermediate face 2a. The contact layer 3 is, for example, formed with indium tin oxide. In particular, the contact layer 3 is light-transmitting. An outer face of the contact layer 3 forms a light passage face 3a of the optoelectronic semiconductor device.

A first boundary region 32 is arranged between the semiconductor layer sequence 1 and the layer stack 2 and a second boundary region 33 is arranged between the layer stack 2 and the contact layer 3. The first boundary region 32 and/or the second boundary region 33 have a lower defect density than an alternative boundary region 31 (not shown in FIG. 1) in which the contact layer 3 is applied directly to the top face 1a.

A method step of a method described here for producing an optoelectronic semiconductor device is explained in greater detail on the basis of the schematic sectional representation of FIG. 2. In the method step shown, a nitride interlayer 202 is applied onto the top face 1a and, following on in the stack direction, a nitride layer 201 is applied onto the nitride interlayer 202. It is however alternatively also possible, unlike in FIG. 2, for no nitride interlayer 202 to be present.

The nitride interlayer 202 and the nitride layer 201 contain a nitride. The nitride interlayer 202 may be formed with indium gallium nitride. The nitride layer 202 may be formed with indium nitride.

In the method step illustrated, oxygen-containing gas 51 is provided. By means of the oxygen-containing gas 51, the nitride layer 201 is oxidized to yield the oxide layer 20. It is here possible for the nitride layer 201 merely to be partially oxidized to yield the oxide layer 20. It is furthermore possible for the nitride layer 201 to be completely oxidized to yield the oxide layer 20.

The nitride interlayer 202 may also be oxidized to yield the first interlayer 21. It is furthermore possible for the nitride interlayer 202 to be only partially oxidized. In particular, part of the nitride interlayer 202 may be oxidized to yield the first interlayer 21, while a further part of the nitride interlayer 202 is not oxidized and forms the second interlayer 22.

FIG. 3 shows an alternative semiconductor device with reference to a schematic sectional representation. The alternative semiconductor device comprises a semiconductor layer sequence 1, which has the same structure as the semiconductor layer sequence 1 of the optoelectronic semiconductor device of FIG. 1. The contact layer 3 is applied onto the top face 1a of the semiconductor layer sequence 1. As a result, an alternative boundary region 31 between the semiconductor layer sequence 1 and the contact layer 3 is obtained. Due to the absence of the layer stack 2 between the semiconductor layer sequence 1 and the contact layer 3, the alternative boundary region 31 has a higher number of defects, contaminants and/or instances of damage. The contact layer 3 of the alternative semiconductor device may, for example, be deposited by means of a gentle deposition method, such as, for example, vapor deposition, in order to minimize damage within the alternative boundary region. The contact layer 3 may alternatively or additionally be applied by means of sputtering.

Figure 4:
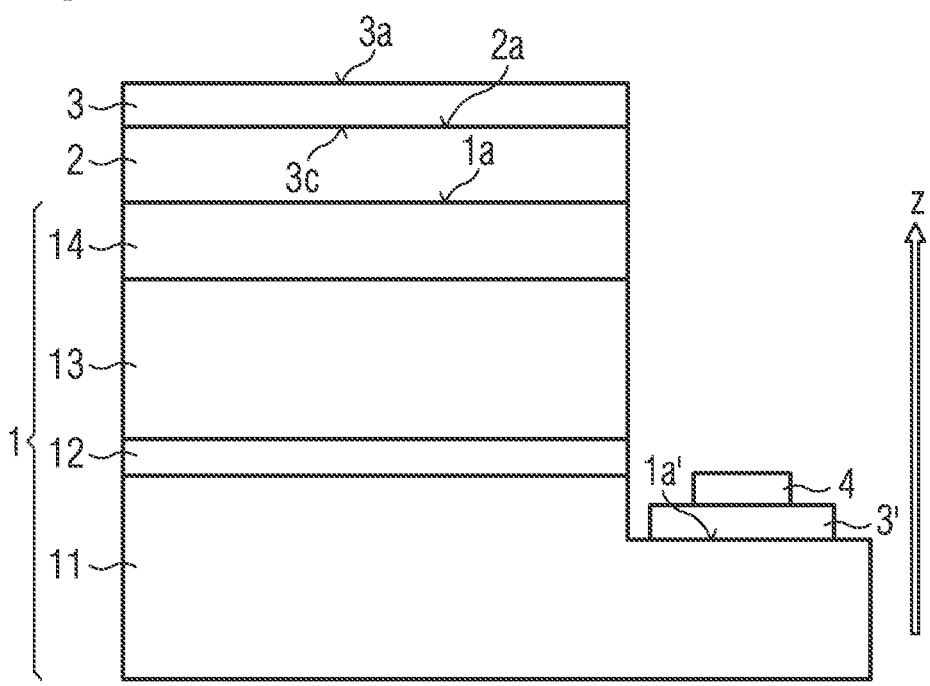
FIG. 4 shows an exemplary embodiment of a semiconductor device described here.

A further exemplary embodiment of an optoelectronic semiconductor device described here is explained in greater detail with reference to the schematic sectional representation of FIG. 4. In contrast with the exemplary embodiment of FIG. 1, a region of the first semiconductor layer 11 is uncovered, in which a further top face 1a' of the semiconductor layer sequence is formed. A further contact layer 3' is applied to the further top face 1a'. The further contact layer 3' has the same structure, in particular the same crystal orientation, as the contact layer 3. It is in particular possible for both the contact layer 3 and the further contact layer 3' to have a (111) crystal orientation of the crystal structure. A contact 4, which is in direct contact with the further contact layer 3', is arranged on the further contact layer 3'. The contact 4 may be formed with a metal, such as, for example, platinum.

Figure 5:
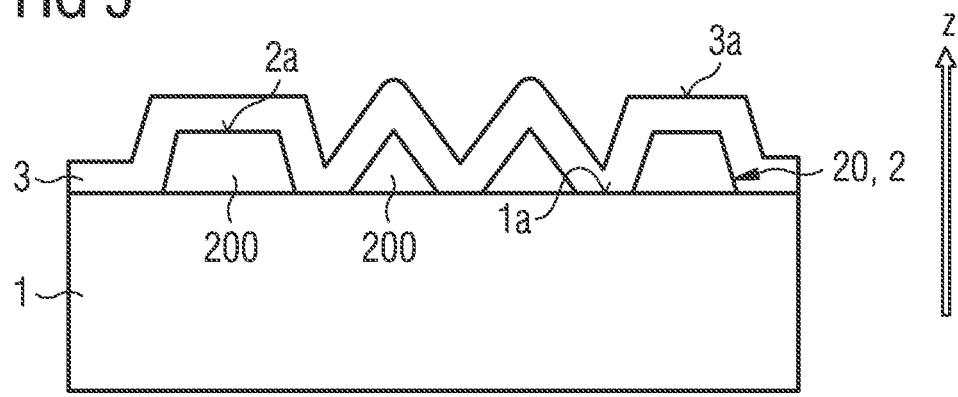
FIG. 5 shows an exemplary embodiment of an optoelectronic semiconductor device described here and of a method described here.

A further exemplary embodiment of a semiconductor device described here and a method described here will be explained in greater detail with reference to the perspective sectional representation in FIG. 5. The layer stack 2 is applied to the top face is of the semiconductor layer sequence 1. The layer stack 2 has in the present case been grown using three-dimensional growth conditions. As a result, the layer stack 2 is subdivided into islands 200. The islands 200 are arranged spaced from one another on the top face 1a. In particular, the islands 200 are not joined together in lateral directions. The islands 200 have a trapezoidal and/or triangular cross-section.

The contact layer 3 is applied onto the interlayer 2a and the regions of the top face is not covered by the layer stack 2 or the oxide layer 20. The shape of the contact layer 3 follows the shape of the layer stack 2. In particular, the radiation passage face 3a is in each case at a uniform distance from the underlying layers. In other words, the contact layer 3 is a conformal layer and, within the bounds of manufacturing tolerances, has a uniform thickness.

Figure 6:
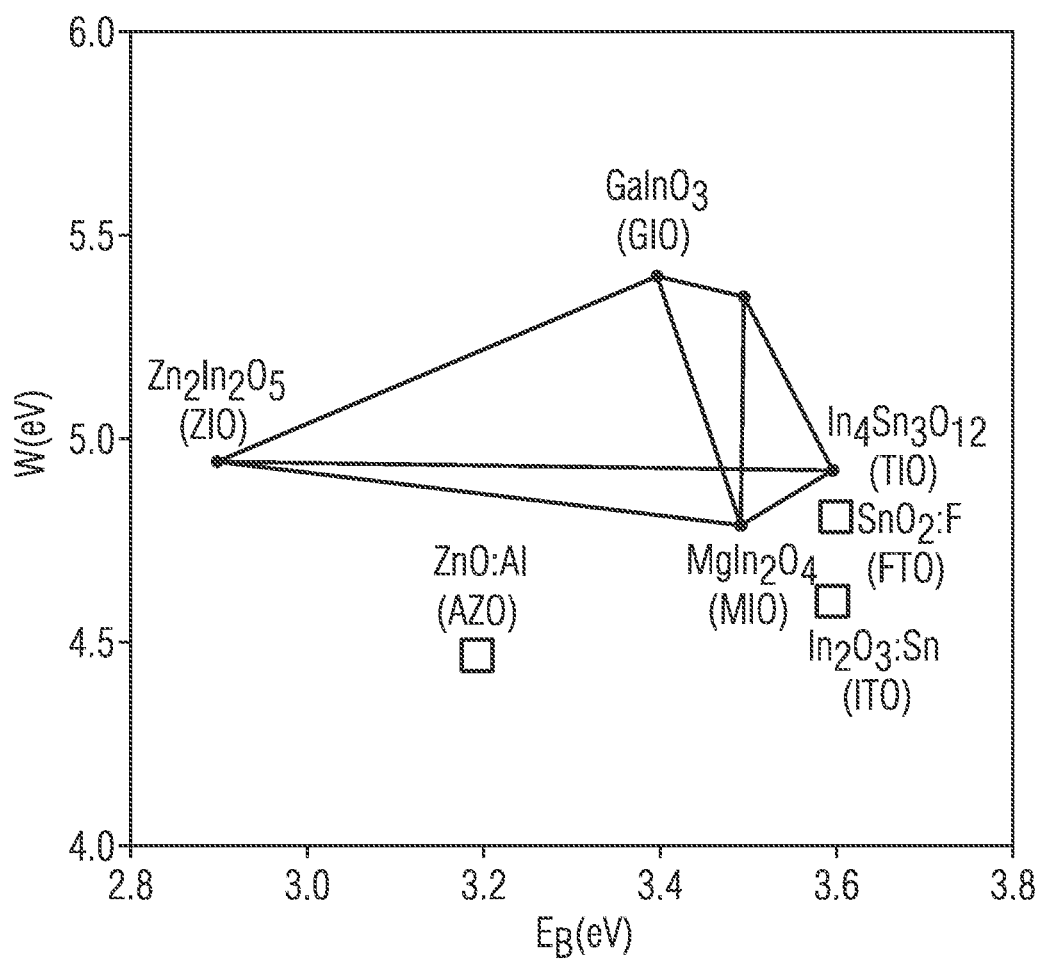
FIG. 6 shows the work function of the materials used as a function of the energy band gap.

FIG. 6 explains in greater detail a mode of operation of the optoelectronic semiconductor device described here on the basis of the work function W as function of the energy band gap $E_B$. The second semiconductor layer 13 and/or the highly doped semiconductor layer 14 is, for example, formed with p-conductive gallium nitride which has a work function of about 7.5 eV. A material which likewise has a high work function is desirable for electrically contacting the highly doped semiconductor layer 14 and/or the second semiconductor layer 13. Platinum (work function: 5.65 eV) or nickel (work function: 5.15 eV) are, for example, suitable for this purpose. Platinum and nickel are, however, opaque and are thus unsuitable as a front surface contact of a semiconductor device. Gallium indium oxide likewise has a high work function of 5.4 eV. In contrast with gallium indium oxide, indium tin oxide (work function: 4.7 to 4.8 eV) is, however, a well known material. Gallium indium oxide furthermore has higher absorption for the light generated in the active zone.

Figure 7:
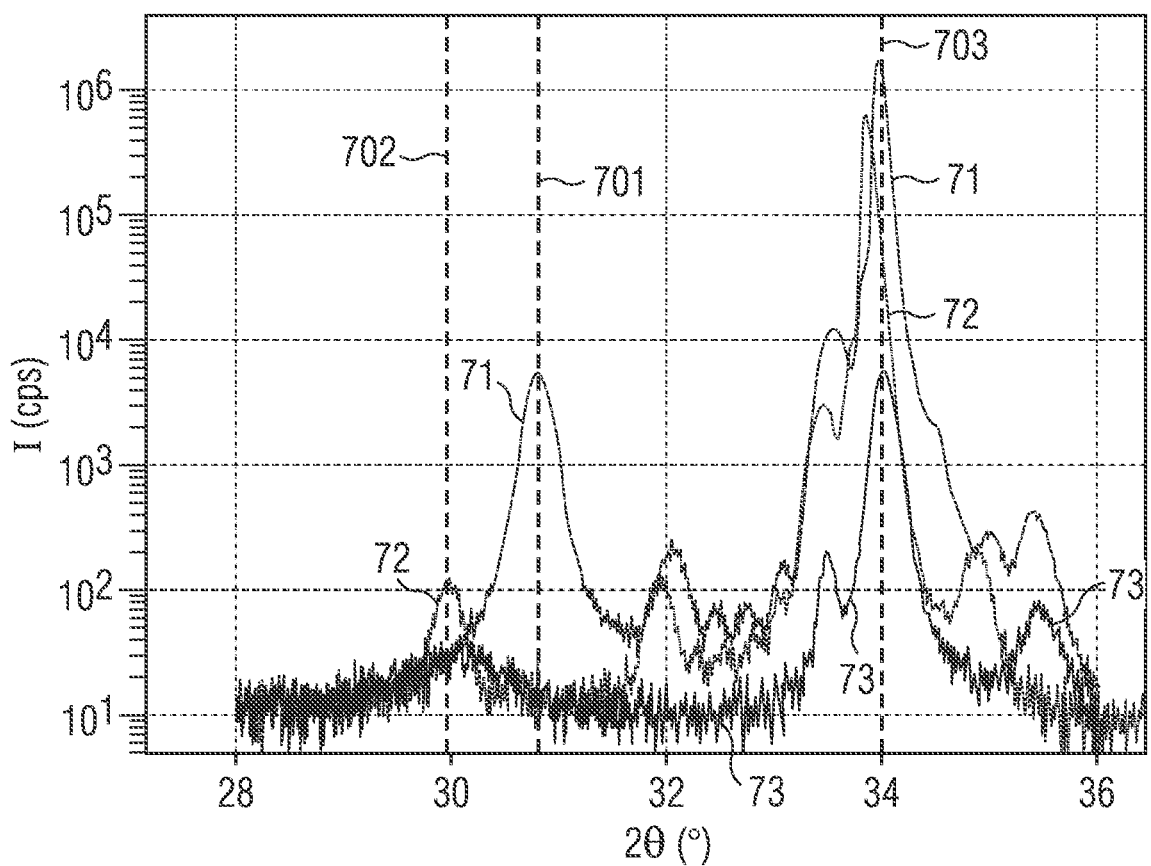
FIG. 7 shows X-ray diffraction spectra of an optoelectronic semiconductor device described here.

On the basis of X-ray diffraction spectra (XRD), FIG. 7 explains in greater detail a mode of operation of a method described here. Signal intensity I in counts per second (cps) is shown as a function of twice the angle of reflection on the plane 2θ in degrees. A spectrum before an oxidation step 71, a spectrum after the oxidation step 72 and a comparison spectrum 73, in which no oxidation was carried out, are shown here.

The spectrum before oxidation 71 has a first maximum 701 and a second maximum 703. The first maximum 701 corresponds to the indium nitride present in the nitride layer 201. The second maximum 703 corresponds to the gallium nitride present in the semiconductor layer sequence 1.

The spectrum after oxidation 72 has a second maximum 702. The second maximum 702 corresponds to the indium oxide produced by oxidation of the oxide layer 20. In addition, the first maximum 701 at indium nitride is no longer apparent. The indium nitride has been oxidized to yield indium oxide. The third maximum 703 is unchanged within the bounds of measuring accuracy. The material of semiconductor layer sequence 1 has thus not been oxidized and/or changed by the oxidation.

The comparison spectrum 73 shows the X-ray diffraction spectrum of an alternative semiconductor device. The comparison spectrum 73 only has, within the bounds of measuring accuracy, the third maximum 703.

Figure 8:
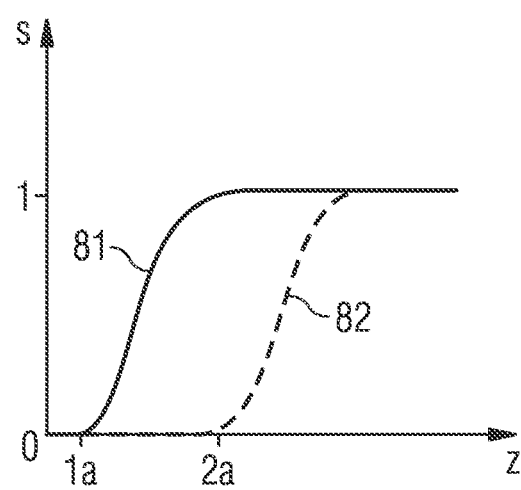
FIG. 8 shows a sketched EDX signal of an optoelectronic semiconductor device described here.

An optoelectronic semiconductor device described here is explained in greater detail on the basis of the sketched EDX spectrum of FIG. 8. A normalized EDX signal S is plotted as a function of position in the stack direction z. An oxide content 81 increases in the region of the top face 1a. A tin content 82 increases in the region of the intermediate face 2a. The rising flanks of the EDX signals for oxide content 81 and tin content 72 are offset from one another in the stack direction z. On the basis of these different positions of the rising flanks, it is possible to detect the presence of the layer stack 2 between the semiconductor layer sequence 1 and the contact layer 3 in the completed semiconductor device.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing an optoelectronic semiconductor device, the method comprising:
providing a semiconductor layer sequence comprising a light-emitting and/or light-absorbing active zone and a top face downstream of the active zone in a stack direction extending perpendicular to a main plane of extension of the semiconductor layer sequence;
applying a layer stack onto the top face, wherein the layer stack comprises a first interlayer formed with indium gallium oxide, an oxide layer containing indium, and an intermediate face downstream of the top face in the stack direction; and
applying a contact layer onto the intermediate face, wherein the contact layer comprises indium tin oxide, wherein the layer stack is, within the bounds of manufacturing tolerances, free of tin,
wherein applying the first interlayer comprises epitaxially depositing a nitride interlayer, formed with indium gallium nitride, and at least partially oxidizing the nitride interlayer to form the first interlayer.

2. The method according to claim 1, wherein applying the oxide layer comprises providing a nitride layer containing indium, and at least partially oxidizing the nitride layer to form the oxide layer.

3. The method according to claim 2, wherein oxidizing is performed after applying the contact layer.

4. The method according to claim 2, wherein the nitride layer is epitaxially deposited under three-dimensional growth conditions such that the nitride layer has a plurality of multilayer islands which are not joined together.

5. The method according to claim 1, wherein oxidizing is performed in a reaction chamber and, while oxidizing, a reaction temperature in the reaction chamber amounts to at least 460° C. and at most 720° C.

6. The method according to claim 1, wherein applying the oxide layer comprises epitaxial depositing indium oxide.

7. The method according to claim 6, wherein epitaxial depositing comprises epitaxial depositing under two-dimensional growth conditions such that the oxide layer is contiguous.

8. The method according to claim 1, wherein the contact layer is applied onto the intermediate face under growth conditions in which, in case of direct application onto the top face, a crystal orientation of a crystal structure of the contact layer is obtained, and wherein the crystal structure of the contact layer has a crystal orientation.

9. A optoelectronic semiconductor device comprising:
a semiconductor layer sequence including a light-emitting and/or light-absorbing active zone and a top face downstream of the active zone in a stack direction extending perpendicular to a main plane of extension of the semiconductor layer sequence;

a layer stack arranged at the top face, the layer stack including an oxide layer containing indium, and an intermediate face downstream of the top face in the stack direction; and a contact layer arranged at the intermediate face, the contact layer comprising indium tin oxide, wherein the layer stack is, within the bounds of manufacturing tolerances, free of tin, and wherein a first boundary region between the semiconductor layer sequence and the layer stack and/or a second boundary region between the layer stack and the contact layer have a lower density of defects than an alternative boundary region between a semiconductor layer sequence and a contact layer of an alternative semiconductor device, in which the contact layer is applied directly onto the semiconductor layer sequence.

10. The optoelectronic semiconductor device according to claim 9, wherein the oxide layer is, within the bounds of manufacturing tolerances, free of gallium.

11. The optoelectronic semiconductor device according to claim 9, wherein the layer stack further includes a first interlayer comprising indium gallium oxide, and wherein the first interlayer is arranged between the semiconductor layer sequence and the oxide layer and directly adjoins the oxide layer.

12. The optoelectronic semiconductor device according to claim 11, wherein the layer stack further includes a second interlayer comprising indium gallium nitride, wherein the second interlayer is arranged between the semiconductor layer sequence and the first interlayer and directly adjoins the top face, and wherein the second interlayer is, within the bounds of manufacturing tolerances, free of oxygen.

13. The optoelectronic semiconductor device according to claim 9, wherein the layer stack includes indium nitride.

14. The optoelectronic semiconductor device according to claim 9, wherein a crystal structure of the contact layer has a crystal orientation.

15. The optoelectronic semiconductor device according to claim 9, wherein the oxide layer has a plurality of multilayer islands which are not joined together.

16. The optoelectronic semiconductor device according to claim 15, wherein an average height of the islands along the stack direction amounts to at least 50 and at most 200 monolayers.

17. The optoelectronic semiconductor device according to claim 9, wherein the oxide layer is contiguous.

18. The optoelectronic semiconductor device according to claim 9, wherein an average thickness of the oxide layer along the stack direction amounts to at least 0.5 and at most 3 monolayers.

19. A optoelectronic semiconductor device comprising:

a semiconductor layer sequence including a light-emitting and/or light-absorbing active zone and a top face downstream of the active zone in a stack direction extending perpendicular to a main plane of extension of the semiconductor layer sequence;

a layer stack arranged at the top face, the layer stack including an oxide layer containing indium, and an intermediate face downstream of the top face in the stack direction; and a contact layer arranged at the intermediate face, the contact layer comprising indium tin oxide, wherein the layer stack is, within the bounds of manufacturing tolerances, free of tin, and wherein the oxide layer has a plurality of multilayer islands which are not joined together.

* * * * *